(12) United States Patent
Liu et al.

(10) Patent No.: US 7,714,604 B2
(45) Date of Patent: May 11, 2010

(54) SYSTEM AND METHOD FOR TESTING AN OPERATING CONDITION OF LEDS ON A MOTHERBOARD

(75) Inventors: Chih-Chiang Liu, Taipei Hsien (TW); Wei-Yuan Chen, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 42 days.

(21) Appl. No.: 12/169,638

(22) Filed: Jul. 9, 2008

(65) Prior Publication Data

US 2009/0108864 A1   Apr. 30, 2009

(30) Foreign Application Priority Data

Oct. 31, 2007  (CN) .......................... 2007 1 0202343

(51) Int. Cl.
G01R 31/26 (2006.01)
G01R 31/00 (2006.01)

(52) U.S. Cl. ....................... 324/765; 324/770
(58) Field of Classification Search .................. None
See application file for complete search history.

(56) References Cited

U.S. PATENT DOCUMENTS 4,808,815 A * 2/1989 Langley .................. 250/227.28
4,843,326 A * 6/1989 Smythe ...................... 324/503
6,028,441 A * 2/2000 Alvord et al. ............... 324/767
6,075,448 A   6/2000 Verkhovskiy
6,490,037 B1 * 12/2002 Schmitt ..................... 356/416
7,382,148 B2 * 6/2008 Dang et al. ................. 324/767
2006/0267626 A1 * 11/2006 Dang et al. ................. 324/770
2008/0103706 A1 * 5/2008 Wu et al. ...................... 702/58
2008/0112607 A1 * 5/2008 Wu et al. .................... 382/147
2009/0262338 A1 * 10/2009 Liu et al. ..................... 356/222

FOREIGN PATENT DOCUMENTS

JP        06308183 A  * 11/1994

* cited by examiner

Primary Examiner—Jermele M Hollington
(74) Attorney, Agent, or Firm—Frank R. Niranjan

(57) ABSTRACT

A computer-implemented method for testing an operating condition of light emitting diodes (LEDs) on a motherboard includes assigning an LED identification for each LED according to positions of the LEDs on the motherboard, selecting a first LED identification for a first LED and a second LED identification for a second LED, setting the first LED in a bright state, the second LED in a dim state, and any remaining LEDs in a flicker state, and controlling the LEDs to operate. The method further includes determining whether the total count of the LEDs in the bright state is equal to one, and whether the total count of the LEDs in the dim state is equal to one, comparing the first LED identification input with the first LED identification, and comparing the second LED identification input with the LED identification, and reporting a comparison result.

15 Claims, 7 Drawing Sheets

SYSTEM AND METHOD FOR TESTING AN OPERATING CONDITION OF LEDS ON A MOTHERBOARD

BACKGROUND

1. Field of the Invention

Embodiments of the present disclosure relate to testing light emitting diodes (LEDs), and more particularly to systems and methods for testing an operating condition of LEDs on a motherboard.

2. Description of Related Art

Light emitting diodes (LEDs) have been used in commercial products since the 1910s, due to several favorable characteristics, such as high shock endurance, long service life, small power consumption, and low heat admittance. In recent years, a printed circuit board (PCB), such as a motherboard, may contain one or more LEDs. The one or more LEDs may be used as external visual signals, for internal surgical diagnostics, and for numerous other applications.

In order to verify whether each LED located on a PCB functions normally, it is usually necessary to power the PCB and manually test certain characteristics of the LEDs. Unfortunately, manually testing the LEDs may destroy the PCB if a voltage passing through the PCB is too high, for example. In another example, viewing a luminance of the LEDs, to verify normal operation of the LCDs, may be inaccurate and error-prone simply because of human error. Additionally, if the PCB includes multiple LEDs, then manually testing the LEDs may become problematic and highly inefficient resulting in decreased productivity in the testing process.

What is needed is a system and method for testing an operating condition of LEDs on a motherboard, wherein increased accuracy and efficiency of test results can be achieved.

SUMMARY

A computer-implemented method for testing an operating condition of a plurality of light-emitting diodes (LEDs) on a motherboard is provided. The method includes: (a) assigning an LED identification for each of the plurality of LEDs according to a position of the plurality of LEDs on the motherboard; (b) selecting a random first LED identification for a first LED and a random second LED identification for a second LED, the first LED and the second LED selected from the plurality of LEDs; (c) setting a work state for the first LED and the second LED by setting the first LED to be in a bright state, setting the second LED to be in a dim state, and setting any remaining LEDs, from the plurality of LEDs, to be in a flicker state; (d) controlling all of the LEDs in step (c) to operate according to the work states; (e) determining a total count of the LEDs in the bright state, and determining a total count of the LEDs in the dim state; (f) receiving a first LED identification input for one of the LEDs that is in the bright state and a second LED identification for one of the LEDs that is in the dim state upon the condition that the total count of the LEDs in the bright state is equal to one, and upon the condition that the total count of the LEDs in the dim state is also equal to one; (g) comparing the first LED identification input with the first LED identification, and comparing the second LED identification input with the second LED identification; and (h) reporting and storing a test result according to the comparison result onto a storage system.

Other advantages and novel features will become more apparent from the following detailed description certain embodiments of the present disclosure when taken in conjunction with the accompanying drawings, in which:

DETAILED DESCRIPTION OF CERTAIN INVENTIVE EMBODIMENTS

All of the processes described below may be embodied in, and fully automated via, software code modules executed by one or more general purpose computers or processors. The code modules may be stored in any type of computer-readable medium or other computer storage device. Some or all of the methods may alternatively be embodied in specialized computer hardware.

Figure 1:
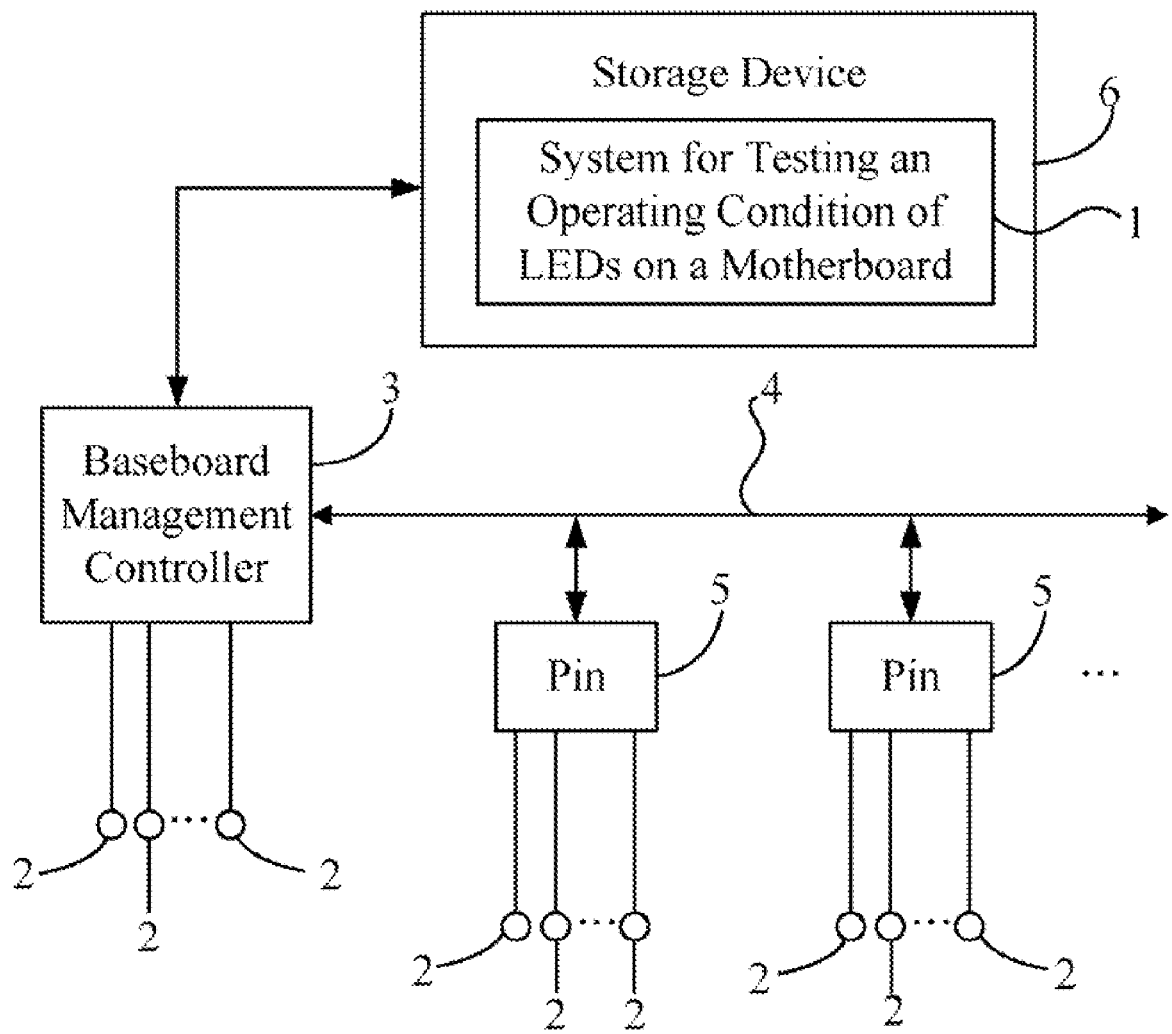
FIG. 1 is a schematic diagram of one embodiment of a system for testing an operating condition of light emitting diodes (LEDs) on a motherboard.

FIG. 1 is a schematic diagram of one embodiment of a system 1 for testing an operating condition of light emitting diodes (LEDs) on a motherboard (hereinafter, "the system 1"). In one embodiment, the system 1 includes a motherboard, comprising a plurality of LEDs 2 to be tested. The motherboard typically includes a baseboard management controller (BMC) 3, an inter-integrated circuit bus (I²C bus) 4, a plurality of pins 5, and a storage device 6. The plurality of pins 5 are electrically connected to the BMC 3 via the I²C bus 4; and the BMC 3 is electrically connected to the storage device 6 via a data bus, such as a data line or a control line.

In the embodiment of FIG. 1, the motherboard may be connected with a monitor (not shown) to provide a user interface for displaying test data and a test result to a user. In one embodiment, some of the LEDs 2 are directly controlled by the BMC 3, while some of the LEDs 2 that are connected to the pins 5 may be indirectly controlled by the BMC 3 via the I²C bus 4. The storage device 6 may be a hard disk or other portable storage device. The system 1 may be installed in the storage device 6, and be configured to test operating conditions of each of the LEDs 2, and be further configured for outputting the test data and the test result to the monitor for display.

Figure 2:
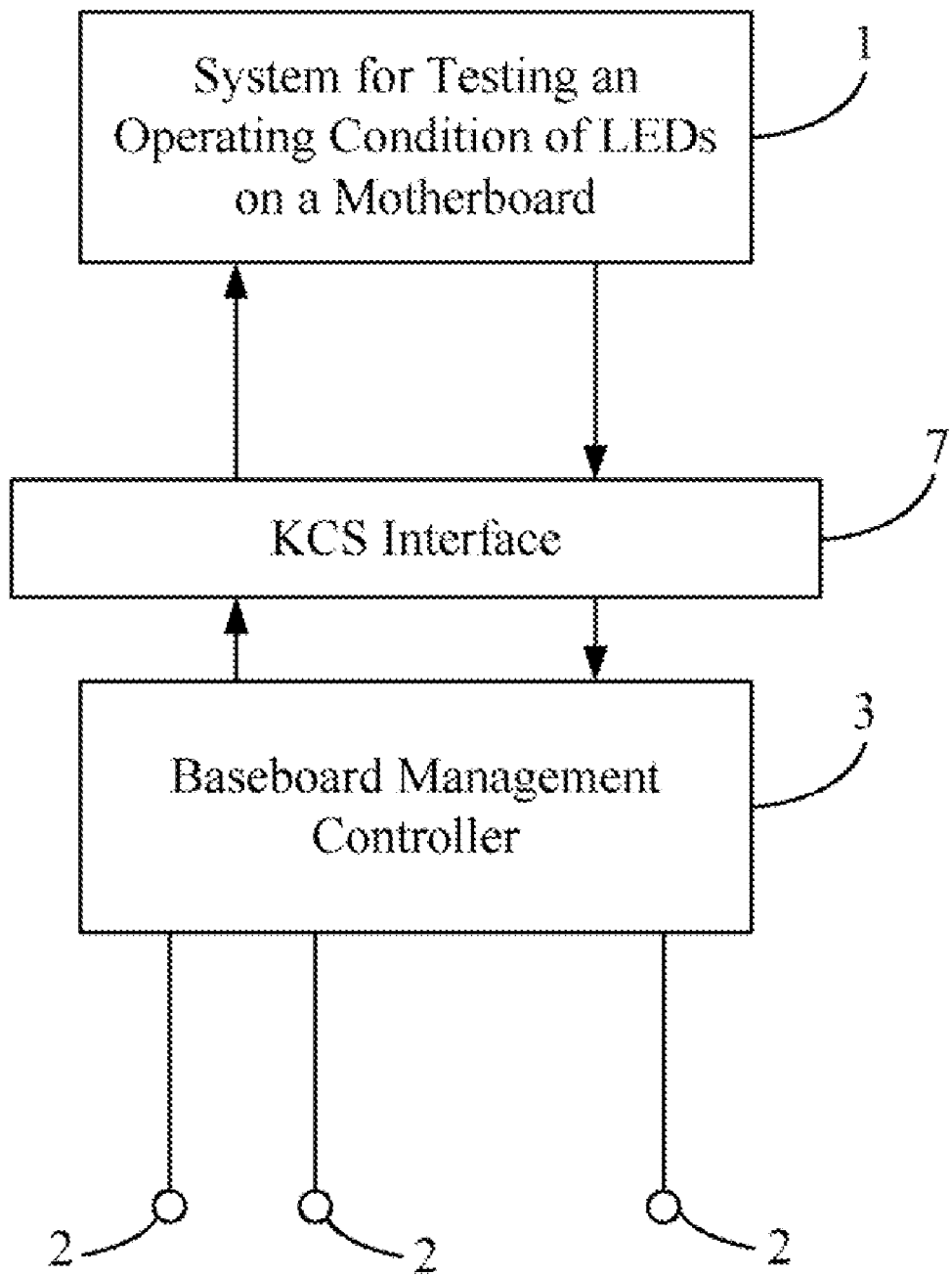
FIG. 2 is a schematic diagram illustrating one embodiment of a signal-flow chart between a baseboard management controller and the system of FIG. 1.

FIG. 2 is a schematic diagram illustrating one embodiment of a signal-flow chart between the BMC 3 and the system 1 of FIG. 1. In one embodiment, the BMC 3 communicates with the system 1 via a keyboard controller style (KCS) interface 7. The BMC 3 generates commands which signal the system 1 to control the LEDs 2 to be either in a bright state, a dim state, or a flicker state. Moreover, the BMC 3 may generate commands to signal the system 1 to test operating conditions of the LEDs 2 in the different states and output a test result.

Figure 3:
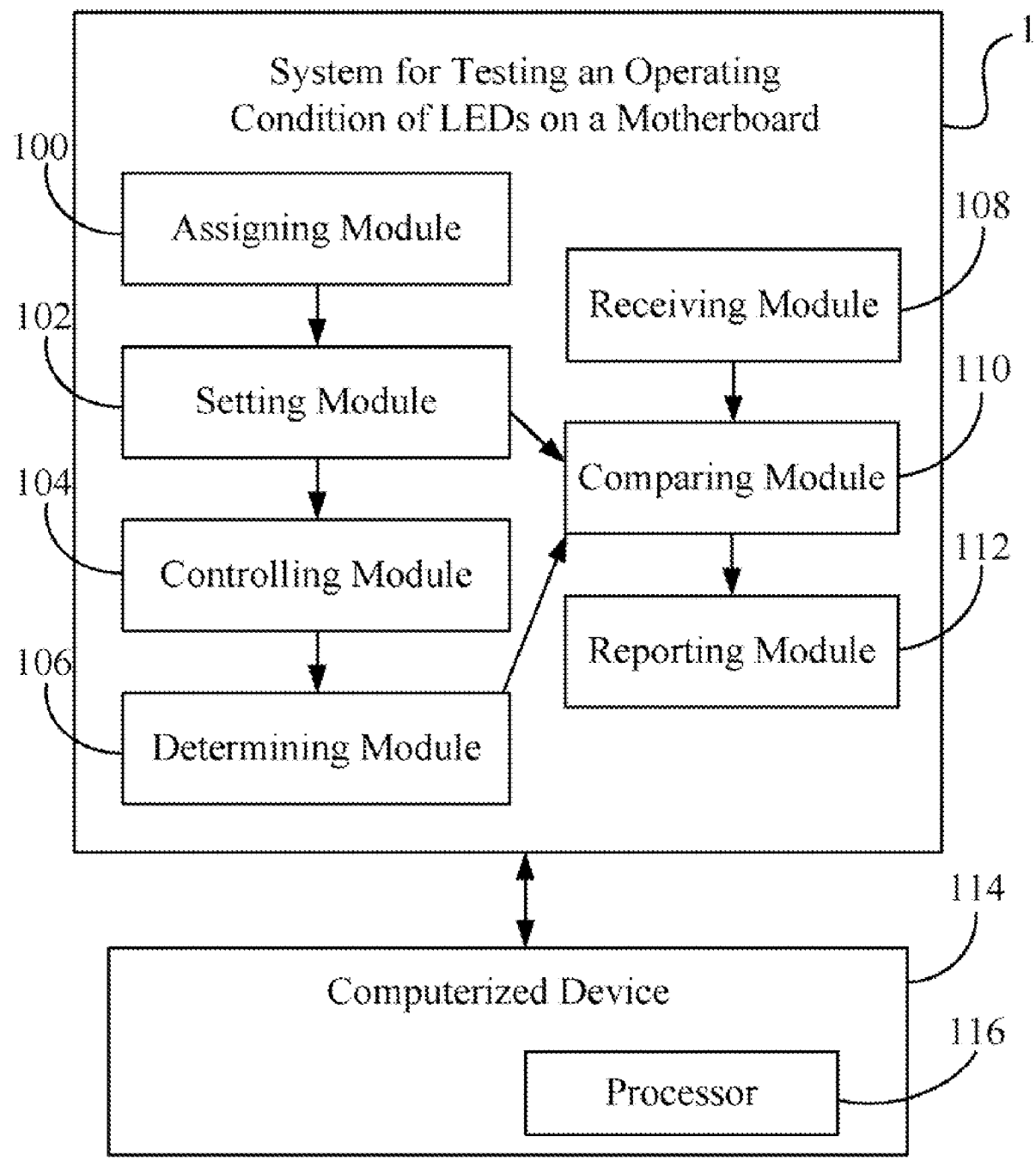
FIG. 3 is a schematic diagram of one embodiment of the system of FIG. 1 comprising software function modules.

FIG. 3 is a schematic diagram of one embodiment of the system 1 comprising software function modules. The software modules may be used to implement certain functions and will be described in greater detail below. In one embodiment, the system 1 may comprise an assigning module 100, a setting module 102, a controlling module 104, a determining module 106, a receiving module 108, a comparing module 110, and a reporting module 112. The various modules 100, 102, 104, 106, 108, 110, 112 of the system 1 may be executed by a processor 116. Accordingly, the system 1 may be run on a computerized device 114, such as a personal computer.

In the embodiment of FIG. 3, a graphical simulation of the motherboard comprising the plurality of LEDs 2 may be displayed on the monitor. In one embodiment, if an LED on a motherboard malfunctions, then an operating condition of the LED may not be acceptable to the system 1.

In one embodiment, the assigning module 100 is configured for assigning an LED identification for each of the LEDs 2 according to a position of each of the LEDs 2 on the motherboard. In another embodiment, the assigning module 100 may assign a serial number corresponding to each of the LEDs 2, according to a function of each of the LEDs 2.

The setting module 102 is configured for randomly selecting one LED (hereinafter a first LED 2) from the plurality of the LEDs 2, and another LED (hereinafter a second LED 2) from the plurality of the LEDs 2, by randomly selecting two LED identifications (i.e. a first LED identification and a second LED identification respectively). The setting module 102 may locate the first LED 2 and the second LED 2 corresponding to the two selected LED identifications and set the first LED 2 to be in a bright state, set the second LED 2 to be in a dim state, and set any remaining LEDs 2 to be in a flicker state. As will be explained with reference to FIG. 4 and FIG. 5, one embodiment of a work state for each of the LEDs 2 configured by the setting module 102 will be illustrated.

It may be appreciated that the terms, "bright state" and "dark state" may refer to a luminosity, or light intensity, of an LED. In one embodiment, the term, "light state" may refer to a higher luminosity, or light intensity, of an LED when compared to the term, "dark state." Similarly, the term, "flicker state" may refer to a turning on and a turning off of an LED for a brief period of time.

Figure 4:
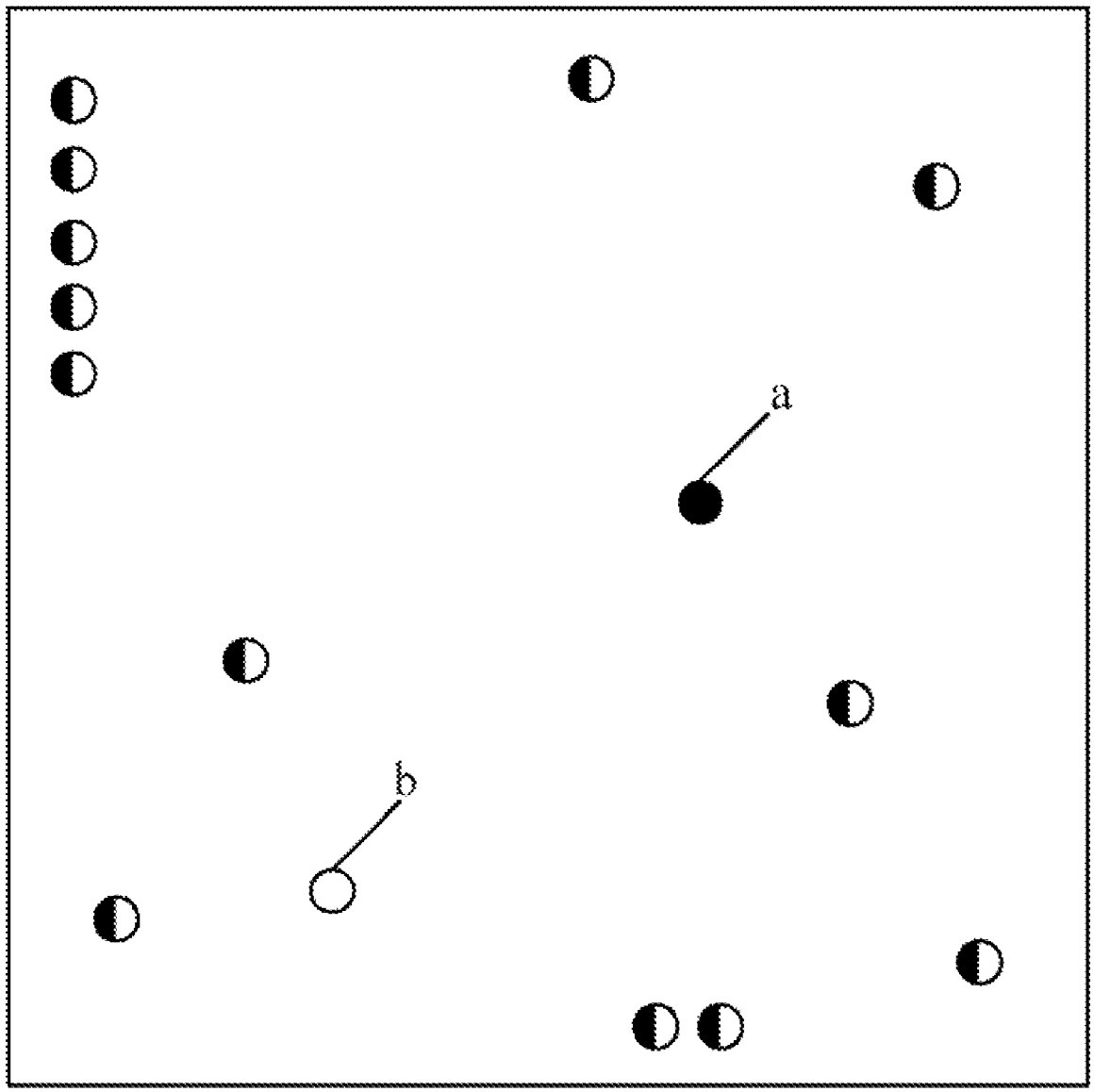
FIG. 4 and FIG. 5 are schematic diagrams illustrating one embodiment of a work state, of each of the LEDs, set by a setting module.
Figure 5:
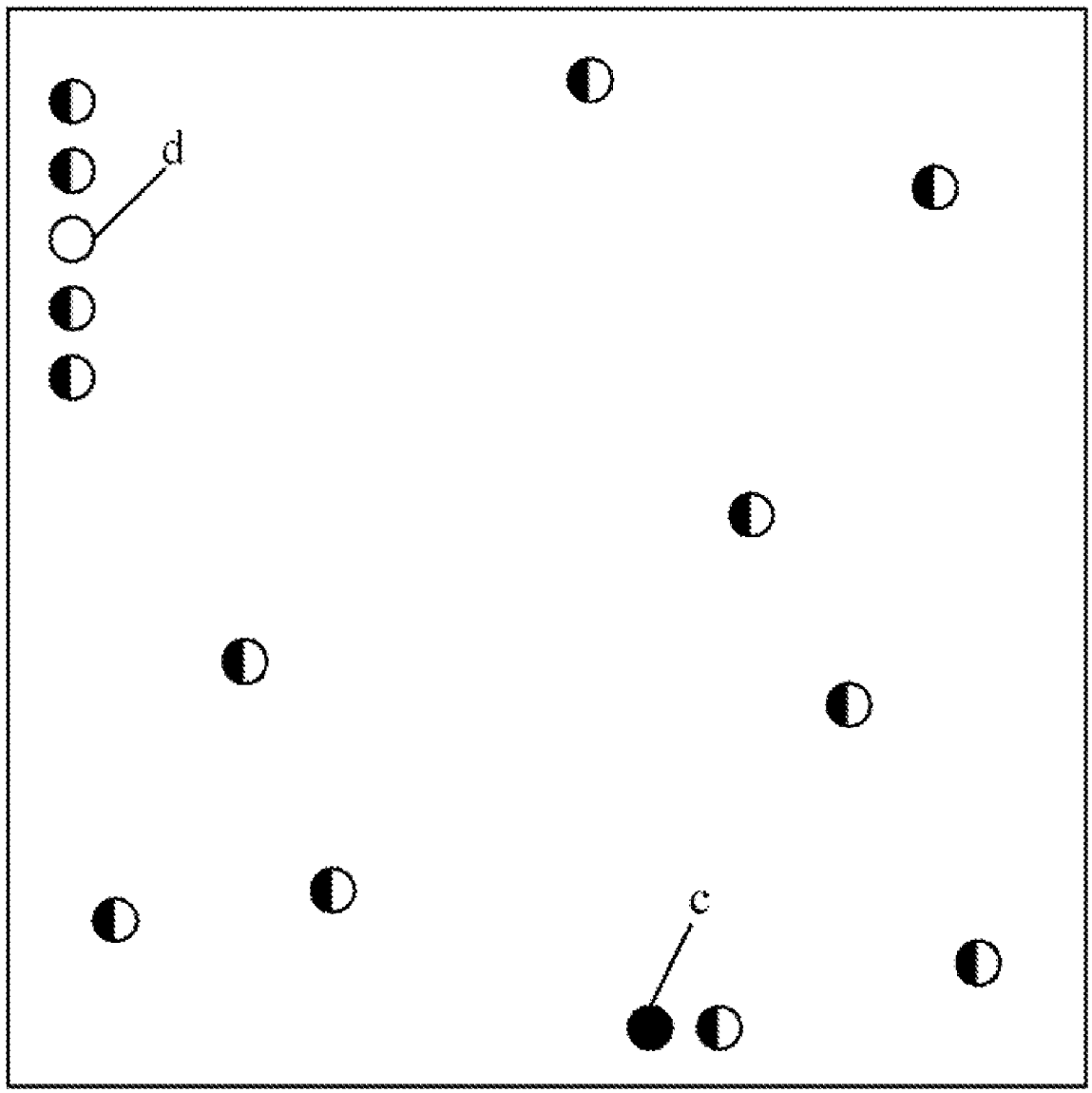

With reference to FIG. 4 and FIG. 5, the setting module 102 may set a work state for each of the LEDs 2. As illustrated in both FIG. 4 and FIG. 5, each circle represents one of the LEDs 2. In one embodiment, the flicker state may comprise a flicker mode and a flicker frequency for the LEDs 2 that are not in the bright state or in the dim state. For example, the setting module 102 may set the flicker mode as "bright to dark" or "dark to bright," and set a flickering time indicating how long to change from "bright to dark" or from "dark to bright" for the LEDs 2.

The controlling module 104 is configured to control and operate all the LEDs 2, and to detect actual work states of the LEDs 2.

The determining module 106 is configured for determining a total count of the LEDs 2 that are in the bright state and a total count of the LEDs 2 that are in the dim state according to actual work states of the LEDs 2.

In one embodiment, the determining module 106 may determine that the LEDs 2 on the motherboard are malfunctioning if the total count of the LEDs 2 in the bright state is more than one or equal to zero, or if the total count of the LEDs 2 in the dim state is more than one or equal to zero. In another embodiment, if the total count of the LEDs 2 in the bright state is equal to one, and the total count of the LEDs 2 in the dim state is also equal to one, then the receiving module 108 is configured for receiving a first LED identification input and a second LED identification input. The receiving module 108 may then display the two LED identification inputs on the monitor. In one embodiment, the first LED identification input should be in the bright state and the second LED identification input should be in the dim state.

The comparing module 110 is configured for comparing the first LED identification with the first LED identification input, and comparing the second LED identification with the second LED identification input. The reporting module 110 is configured for reporting a test result according to the comparison result as noted above, and storing the test result in a storage system. The storage system is at least one of a hard disk drive, a compact disc, a digital video disc, or a tape drive. For example, if the first LED identification and the first LED identification input are identical, and the second LED identification and the second LED identification input are also identical, then the reporting module 110 may output a number identical notification that indicates the LEDs 2 are working normally. In another example, if the first LED identification input is different from the first LED identification, or if the second LED identification input is different from the second LED identification, then the reporting module 110 outputs a number different notification that indicates the LEDs 2 are malfunctioning.

Figure 6:
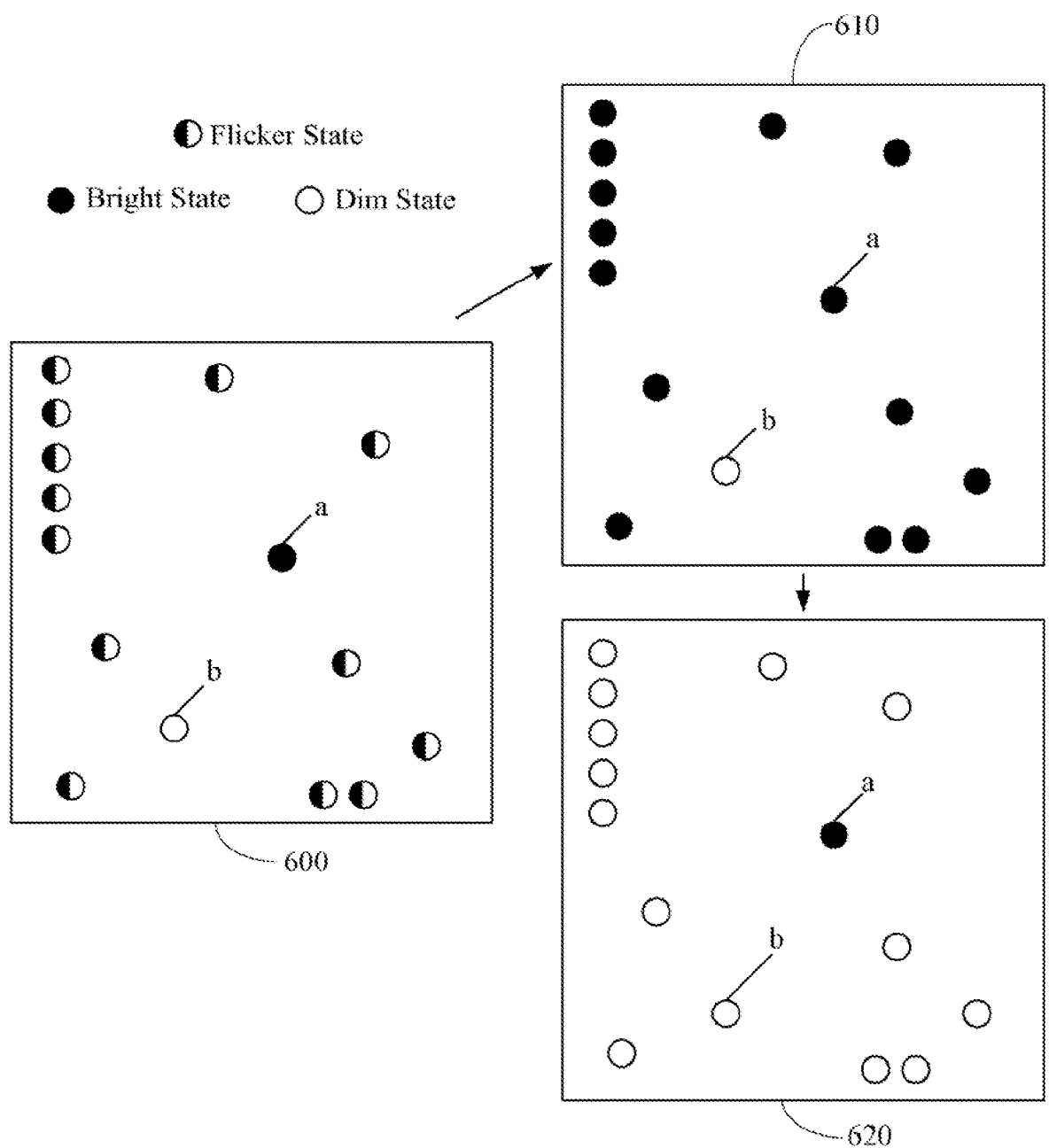
FIG. 6 is a schematic diagram illustrating one embodiment of the LEDs under a normal operating condition.

FIG. 6 is a schematic diagram illustrating one embodiment of the LEDs 2 in a normal state as shown in block 600. In one embodiment, if all the LEDs 2 on the motherboard are working normally, then the setting module 102 may set an LED "a" in the bright state, set an LED "b" in the dim state, set any remaining LEDs 2 in the flicker state, and set the flicker mode, for the remaining LEDs, as "bright to dark." Block 610 and block 620 illustrate one embodiment of actual work states of the LEDs 2 as described above.

Figure 7:
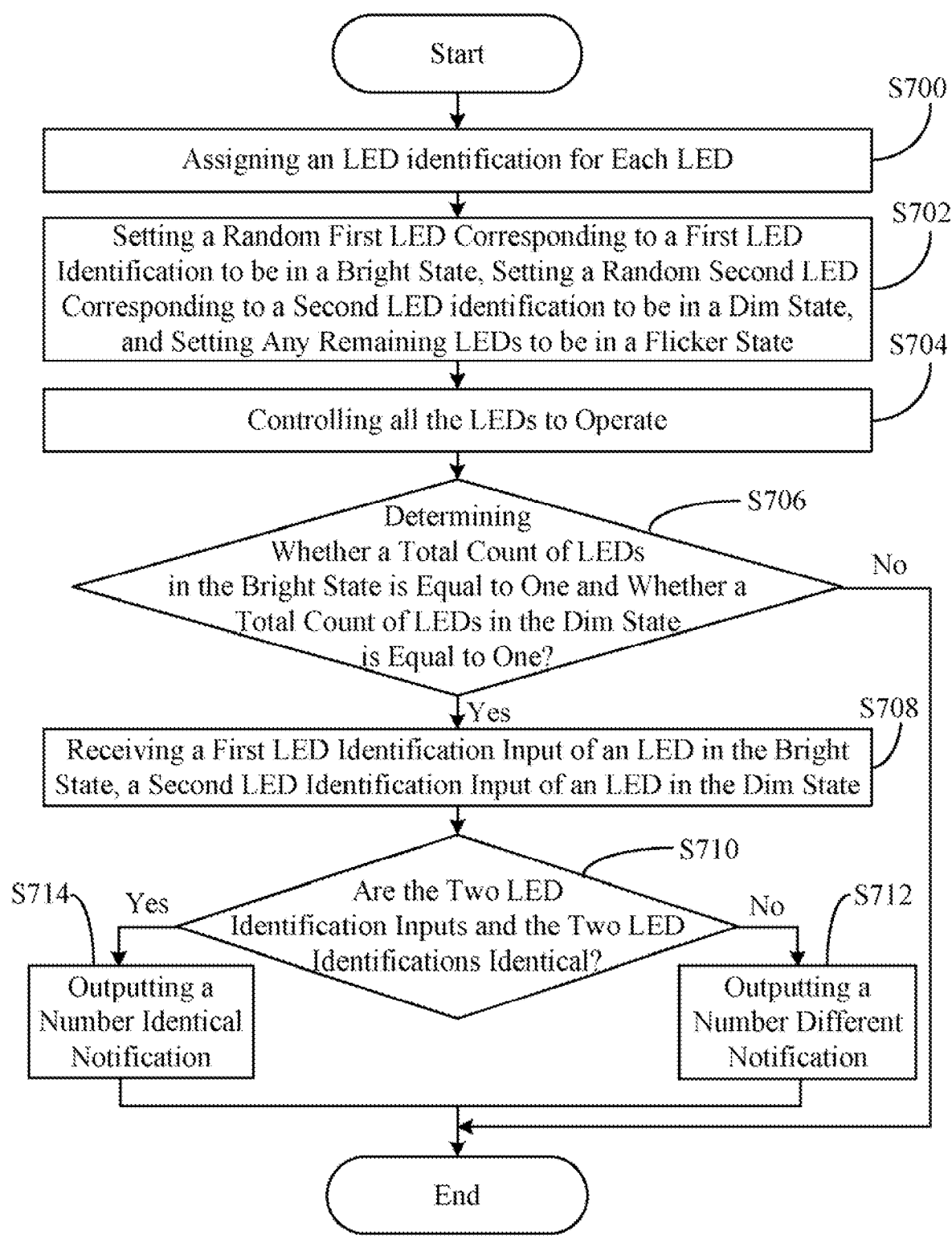
FIG. 7 is a flowchart of one embodiment of a method for testing an operating condition of LEDs on a motherboard.

FIG. 7 is a flowchart of one embodiment of a method for testing an operating condition of the LEDs 2 on a motherboard. Depending on the embodiment, additional blocks may be added, others removed, and the ordering of the blocks may be changed. In block S700, the assigning module 100 assigns an LED identification for each of the LEDs 2 according to a position of each of the LEDs 2 on the motherboard.

In block S702, the setting module 102 randomly selects a first LED 2 and a second LED 2, from the plurality of the LEDs 2, by randomly selecting a corresponding first LED identification and a corresponding second LED identification respectively. The setting module 102 may then locate the first LED 2 and the second LED 2 corresponding to the two selected LED identifications, and set the first LED 2 to be in a bright state, set the second LED 2 to be in a dim state, and set any remaining LEDs 2 to be in the flicker state. In this block, the setting module 102 may also set a flicker mode and a flicker frequency for the remaining LEDs 2.

In block S704, the controlling module 104 controls all the LEDs 2, and detects an actual work state for each of the LEDs 2.

In block S706, the determining module 106 determines a total count of the LEDs 2 that are in the bright state and determines a total count of the LEDs 2 that are in the dim state. It may be understood that the determining may be according to the actual work state of each of the LEDs 2. If the total count of LEDs in the bright state and the total count of the LEDs 2 in the dim state are both equal to one, then the flow may move to block 708. Otherwise, if the total count of the LEDs 2 in the bright state is more than one or equal to zero, or if the total count of the LEDs 2 in the dim state is more than one or equal to zero, (i.e. the LEDs 2 are malfunctioning), then the procedure ends.

In block S708, the receiving module 108 receives a first LED identification input and a second LED identification input, and displays the two LED identification inputs on the monitor. The first LED identification input corresponding to the LED 2 should be in the bright state and the second LED identification input corresponding to the LED 2 should be in the dim state.

In block S710, the comparing module 110 determines if the two LED identification inputs in block S708 are identical by comparing the first LED identification input with the first LED identification and comparing the second LED identification input with the second LED identification.

In one embodiment, if the first LED identification input is different from the first LED identification, or the second LED identification input is different from the second LED identification, then the reporting module 110 outputs a number different notification that indicates the LEDs 2 are malfunctioning as shown in block S712, and determines a malfunctioning LED.

In another embodiment, if the first LED identification input and the first LED identification are identical, and the second LED identification input and the second LED identification are identical, in block S714, the reporting module 110 outputs a number identical notification that indicates the LEDs 2 are working normally.

In one embodiment, a user may use the setting module 102 to repeatedly select two LED identifications to test the LEDs 2 until all of the LEDs 2 have been tested. For example, after the above blocks, S700-S714, the user may use the setting module 102 to reselect two LED identifications, and repeat the blocks S702-S710 to test the LEDs 2 again. In one embodiment, both of the two reselected LED identifications may be different from the first LED identification and the second LED identification. FIG. 5 illustrates one embodiment of how the LEDs "c" and "d" are different from the LEDs "a" and "b" in FIG. 4.

In another embodiment, if each of the LEDs 2 cannot be assigned an LED identification, then the setting module 102 may randomly select two LEDs 2 to test as illustrated in block S702.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A computer-implemented method for testing an operating condition of a plurality of light-emitting diodes (LEDs) on a motherboard, comprising:
    (a) assigning an LED identification for each of the plurality of LEDs according to a position of the plurality of LEDs on the motherboard;
    (b) selecting a random first LED identification for a first LED and a random second LED identification for a second LED, the first LED and the second LED selected from the plurality of LEDs;
    (c) setting a work state for the first LED and a work state for the second LED by setting the first LED to be in a bright state, setting the second LED to be in a dim state, and setting any remaining LEDs, from the plurality of LEDs, to be in a flicker state;
    (d) controlling all of the LEDs in step (c) to operate according to the work states;
    (e) determining a total count of the LEDs in the bright state, and determining a total count of the LEDs in the dim state;
    (f) receiving a first LED identification input for one of the LEDs that is in the bright state and a second LED identification for one of the LEDs that is in the dim state upon the condition that the total count of the LEDs in the bright state is equal to one, and upon the condition that the total count of the LEDs in the dim state is also equal to one;
    (g) comparing the first LED identification input with the first LED identification, and comparing the second LED identification input with the second LED identification; and
    (h) reporting and storing a test result according to the comparison result onto a storage system.

2. The method according to claim 1, further comprising:
    reselecting two LED identifications for two other LEDs, the other two LEDs selected from the plurality of LEDs, and repeating from step (c) to step (h) until all of the LEDs on the motherboard have been tested.

3. The method according to claim 1, wherein step (h) comprises:
    reporting a number identical notification that indicates the LEDs, from the plurality of LEDs, are working normally upon the condition that the first LED identification input and the first LED identification are identical, and upon the condition that the second LED identification input and the second LED identification are also identical;
    reporting a number different notification that indicates the LEDs, from the plurality of LEDs, are malfunctioning upon the condition that the first LED identification input is different from the first LED identification; and
    reporting a number different notification that indicates the LEDs, from the plurality of LEDs, are malfunctioning upon the condition that the second LED identification input is different from the second LED identification.

4. The method according to claim 1, wherein step (e) further comprises:
    determining a malfunctioning LED, from the plurality of LEDs, upon the condition that the total count of the LEDs, from the plurality of LEDs, in the bright state is more than one or equal to zero;
    determining a malfunctioning LED, from the plurality of LEDs, upon the condition that the total count of the LEDs, from the plurality of LEDs, in the dim state is more than one or equal to zero.

5. The method according to claim 1, wherein the storage system is at least one of a hard disk drive, a compact disc, a digital video disc, and a tape drive.

6. A system for testing an operating condition of light-emitting diodes (LEDs) on a motherboard, comprising:
    an assigning module configured for assigning an LED identification for each of the LEDs according to a position of each of the LEDs on the motherboard;
    a setting module configured for randomly selecting a first LED identification for a first LED and a second LED identification for a second LED, and further configured for setting a work state for the first LED and a work state for the second LED, by setting the first LED to be in a bright state, setting the second LED to be in a dim state, and setting any remaining LEDs, not previously selected, to be in a flicker state;
    a controlling module configured for controlling the LEDs to operate according to the at least one work state, the controlling module further configured for determining actual work states of the LEDs;
    a determining module configured for determining a total count of the LEDs in the bright state and determining a total count of the LEDs in the dim state, the determining based on the actual work states, the actual work states selected from the work states set for the first and second LEDs;

a receiving module configured for receiving a first LED identification input from an LED in the bright state and a second LED identification input from an LED in the dim state;

a comparing module configured for comparing the first LED identification input with the first LED identification, and for comparing the second LED identification input with the second LED identification;

a reporting module configured for reporting a test result according to the comparison result; and at least one processor that executes the assigning module, the setting module, the controlling module, the determining module, the receiving module, the comparing module, and the reporting module.

7. The system according to claim 6, wherein the setting module is further configured for setting a flicker mode and a flicker frequency for any remaining LEDs not previously selected from the LEDs on the motherboard.

8. The system according to claim 6, wherein the test result comprises at least one of the LEDs are working normally and the LEDs are malfunctioning.

9. The system according to claim 8, wherein the reporting module is further configured for reporting a number identical notification when the LEDs are working normally.

10. The system according to claim 8, wherein the reporting module is further configured for reporting a number different notification when the LEDs are malfunctioning.

11. A computer-readable medium having stored thereon instructions for testing an operating condition of a plurality of light-emitting diodes (LEDs) on a motherboard, the computer-readable medium, when executed by a computer, causing the computer to perform a method, the method comprising:

(a) assigning an LED identification for each of the plurality of LEDs according to a position of the plurality of LEDs on the motherboard;

(b) selecting a random first LED identification for a first LED and a random second LED identification for a second LED, the first LED and the second LED selected from the plurality of LEDs;

(c) setting a work state for the first LED and a work state for the second LED by setting the first LED to be in a bright state, setting the second LED to be in a dim state, and setting any remaining LEDs, from the plurality of LEDs, to be in a flicker state;

(d) controlling all of the LEDs in step (c) to operate according to the work states;

(e) determining a total count of the LEDs in the bright state, and determining a total count of the LEDs in the dim state;

(f) receiving a first LED identification input for one of the LEDs that is in the bright state and a second LED identification for one of the LEDs that is in the dim state upon the condition that the total count of the LEDs in the bright state is equal to one, and upon the condition that the total count of the LEDs in the dim state is also equal to one;

(g) comparing the first LED identification input with the first LED identification, and comparing the second LED identification input with the second LED identification; and (h) reporting and storing a test result according to the comparison result onto a storage system.

12. The medium according to claim 11, wherein the storage system is at least one of a hard disk drive, a compact disc, a digital video disc, and a tape drive.

13. The medium according to claim 11, wherein the method further comprises:

reselecting two LED identifications for two other LEDs, the other two LEDs selected from the plurality of LEDs, and repeating from step (c) to step (h) until all of the LEDs on the motherboard have been tested.

14. The medium according to claim 1, wherein step (h) comprises:

reporting an identical notification that indicates the LEDs are working normally upon the condition that the first LED input and the state of the first LED are identical, and upon the condition that the second LED input and the state of the second LED are also identical;

reporting a different notification that indicates the LEDs are malfunctioning upon the condition that the first LED input is different from the state of the first LED; and reporting a different notification that indicates the LEDs are malfunctioning upon the condition that the second LED input is different from the state of the second LED.

15. The medium according to claim 11, wherein step (e) further comprises:

determining a malfunctioning LED upon the condition that the total count of the LEDs in the bright state is more than one or equal to zero; and determining a malfunctioning LED upon the condition that the total count of the LEDs in the dim state is more than one or equal to zero.

\* \* \* \* \*